US009691948B2

(12) United States Patent
Lin et al.

(10) Patent No.: US 9,691,948 B2
(45) Date of Patent: Jun. 27, 2017

(54) METHOD FOR MANUFACTURING LIGHT EMITTING DEVICE WITH PREFERABLE ALIGNMENT PRECISION WHEN TRANSFERRING SUBSTRATES

(71) Applicant: PlayNitride Inc., Tainan (TW)

(72) Inventors: Tzu-Yang Lin, Tainan (TW); Yu-Hung Lai, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/001,261

(22) Filed: Jan. 20, 2016

(65) Prior Publication Data

US 2017/0069804 A1    Mar. 9, 2017

(30) Foreign Application Priority Data

Sep. 4, 2015 (TW) .............................. 104129273 A

(51) Int. Cl.
| | |
|---|---|
| *H01L 33/24* | (2010.01) |
| *H01L 33/30* | (2010.01) |
| *H01L 33/08* | (2010.01) |
| *H01L 33/54* | (2010.01) |
| *H01L 33/00* | (2010.01) |
| *H01L 33/36* | (2010.01) |

(52) U.S. Cl.
CPC .......... *H01L 33/54* (2013.01); *H01L 33/0095* (2013.01); *H01L 33/36* (2013.01); *H01L 2933/005* (2013.01); *H01L 2933/0016* (2013.01); *H01L 2933/0033* (2013.01)

(58) Field of Classification Search
CPC ..... H01L 33/54; H01L 33/0095; H01L 33/36; H01L 2933/0016; H01L 27/15; H01L 27/153; H01L 27/156; H01L 2933/005
See application file for complete search history.

(56) References Cited

U.S. PATENT DOCUMENTS

| | | | |
|---|---|---|---|
| 8,039,860 B2 * | 10/2011 | Moon | H01L 33/382 |
| | | | 257/98 |
| 2003/0189212 A1 | 10/2003 | Yoo | |
| 2005/0173692 A1 | 8/2005 | Park et al. | |
| 2007/0099317 A1 | 5/2007 | Ryu et al. | |
| 2008/0048206 A1 | 2/2008 | Lee et al. | |
| 2010/0314643 A1 | 12/2010 | Lin | |

(Continued)

OTHER PUBLICATIONS

"Office Action of Taiwan Counterpart Application", issued on Aug. 16, 2016, p. 1-p. 6.

*Primary Examiner* — Thomas L Dickey
*Assistant Examiner* — Damon Hillman
(74) *Attorney, Agent, or Firm* — Jianq Chyun IP Office

(57) ABSTRACT

A method for manufacturing a light emitting device is provided. Multiple epitaxial structures and multiple bonding pads formed thereon are formed on a growth substrate. A first adhesive layer is formed on the growth substrate, wherein the first adhesive layer encapsulates the epitaxial structures and the bonding pads. A first substrate is provided on the first adhesive layer. The growth substrate is removed, so as to expose the epitaxial structures and the first adhesive layer. A second substrate and a second adhesive layer disposed thereon are provided, wherein the epitaxial structures are adhered on the second substrate by the second adhesive layer. The first adhesive layer and the first substrate are removed.

22 Claims, 17 Drawing Sheets

(56) References Cited

U.S. PATENT DOCUMENTS

| | | | |
|---|---|---|---|
| 2013/0023074 A1 | 1/2013 | Horng et al. | |
| 2013/0285080 A1* | 10/2013 | Naito | H01L 33/38 257/88 |
| 2014/0367697 A1 | 12/2014 | Wang et al. | |
| 2015/0054008 A1* | 2/2015 | Rhee | H01L 25/0753 257/89 |
| 2016/0155892 A1* | 6/2016 | Li | H01L 24/00 257/89 |

* cited by examiner

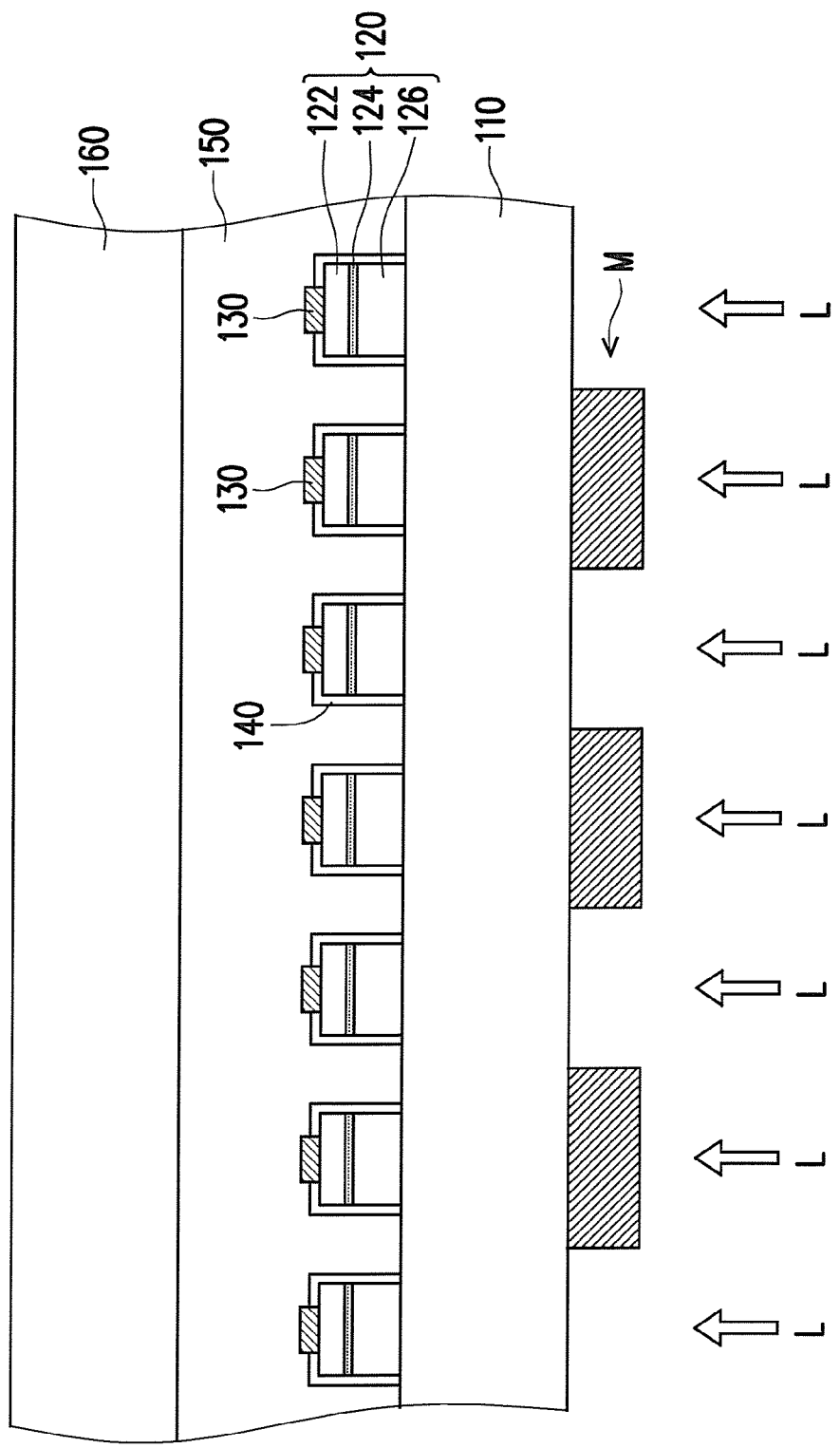
FIG. 1E"

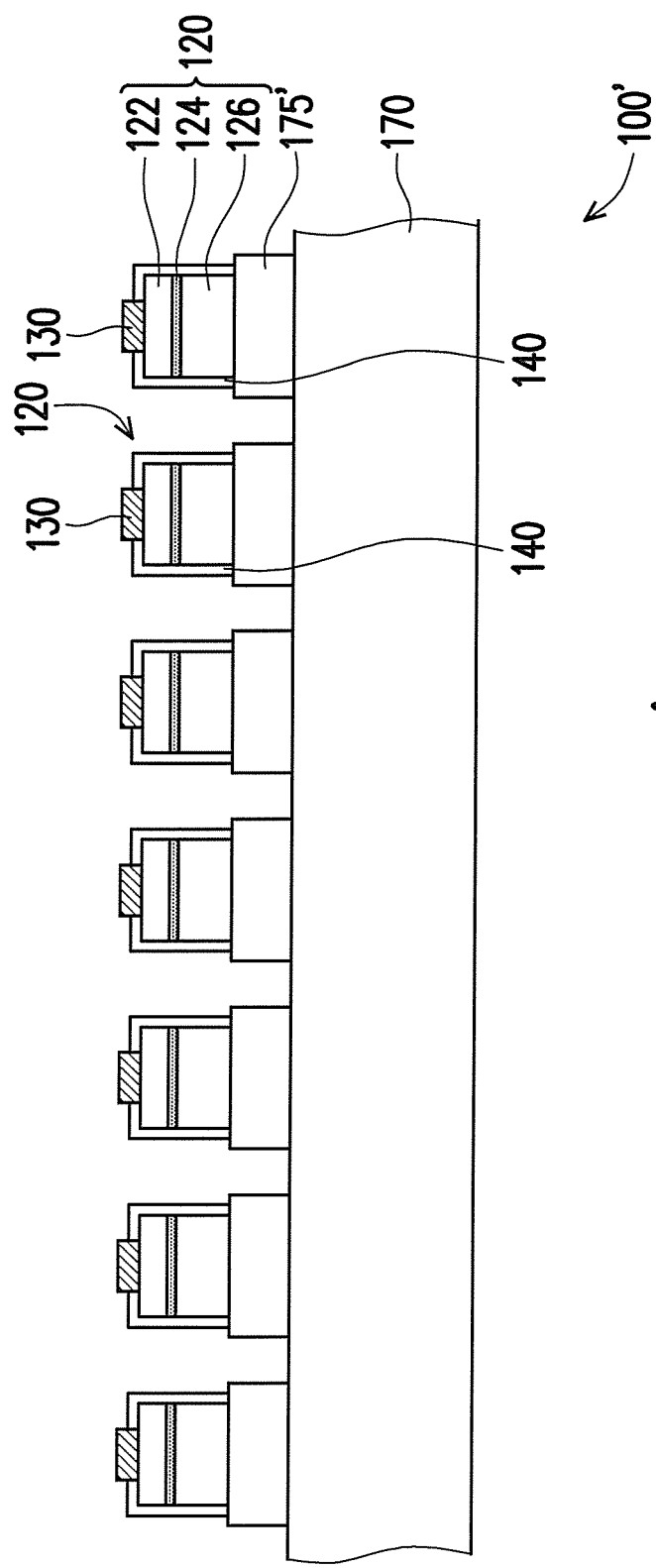

METHOD FOR MANUFACTURING LIGHT EMITTING DEVICE WITH PREFERABLE ALIGNMENT PRECISION WHEN TRANSFERRING SUBSTRATES

CROSS-REFERENCE TO RELATED APPLICATION

This application claims the priority benefit of Taiwan application Ser. No. 104129273, filed on Sep. 4, 2015. The entirety of the above-mentioned patent application is hereby incorporated by reference herein and made a part of this specification.

BACKGROUND OF THE INVENTION

Field of the Invention

The invention relates to a method for manufacturing a semiconductor device, and more particularly, to a method for manufacturing a light emitting device.

Description of Related Art

In current manufacturing process of a light emitting diode (LED) structure, first of all, an epitaxial structure is formed on a growth substrate. The epitaxial structure includes a first-type semiconductor layer, a light emitting layer and a second-type semiconductor layer sequentially formed on the growth substrate. Subsequently, a permanent substrate or a temporary substrate is bonded on the second-type semiconductor layer to form the LED structure or a LED structure to be transferred. In general, the growth substrate mainly uses a sapphire substrate, which has a thermal expansion coefficient very different from a thermal expansion coefficient of the permanent substrate or the temporary substrate. Therefore, when the epitaxial structure is transferred from the growth substrate onto the permanent substrate or the temporary substrate, a shift phenomenon may occur under influence of the thermal stress to affect an alignment precision of the product or the device.

SUMMARY OF THE INVENTION

The invention is directed to a method for manufacturing a light emitting device, which can provide a preferable alignment precision when transferring substrates.

The method for manufacturing the light emitting device of the invention includes the following manufacturing steps. A plurality of epitaxial structures is formed on a growth substrate. The epitaxial structures are distributively disposed on the growth substrate and expose a part of the growth substrate. A plurality of bonding pads is formed on the epitaxial structures. A first adhesive layer is formed on the growth substrate. The first adhesive layer encapsulates the epitaxial structures and the bonding pads. A first substrate is provided on an upper surface of the first adhesive layer. The first substrate is adhered on the growth substrate by the first adhesive layer. The growth substrate is removed, so as to expose a bottom surface of each of the epitaxial structures and a lower surface of the first adhesive layer opposite to the upper surface. A second substrate and a second adhesive layer disposed on the second substrate are provided. The second adhesive layer is located between the first substrate and the second substrate, and the bottom surface of each of the epitaxial structures is adhered on the second substrate by the second adhesive layer. The first adhesive layer and the first substrate are removed.

In an embodiment of the invention, while foaming the first adhesive layer on the growth substrate, the first adhesive layer covers the part of the growth substrate exposed by the epitaxial structures, and fills gaps between the epitaxial structures.

In an embodiment of the invention, the step of forming the epitaxial structures on the growth substrate includes: forming an epitaxial film on the growth substrate; and patterning the epitaxial film, so as to define the epitaxial structures. Each of the epitaxial structures includes a first-type semiconductor layer, an active layer and a second-type semiconductor layer. The active layer is located between the first-type semiconductor layer and the second-type semiconductor layer, and the second-type semiconductor layer is located between the active layer and the growth substrate.

In an embodiment of the invention, a thickness of the first adhesive layer is higher than a height of each of the epitaxial structures.

In an embodiment of the invention, the first adhesive layer is formed by stacking at least one layer of an insulation material layer.

In an embodiment of the invention, a method of forming the first adhesive layer on the growth substrate includes a spin coating method.

In an embodiment of the invention, a method of removing the growth substrate includes a laser lift-off method.

In an embodiment of the invention, the step of removing the first adhesive layer and the first substrate includes: removing the first substrate in a lift-off manner; and removing the first adhesive layer by a laser ablation, an ultraviolet irradiation, a solution decomposition or a thermal decomposition.

In an embodiment of the invention, the method for manufacturing the light emitting device further includes: after removing the first adhesive layer and the first substrate, bonding the bonding pads to a plurality of pads of an external circuit by a thermal compression process; and removing the second adhesive layer and the second substrate, so as to expose the bottom surfaces of the epitaxial structures.

In an embodiment of the invention, the step of removing the second adhesive layer and the second substrate includes: removing the second substrate in a lift-off manner; and removing the second adhesive layer in a wet etching manner.

In an embodiment of the invention, after removing the first adhesive layer and the first substrate, the second adhesive layer is patterned by using the epitaxial structures as an etching mask, so that the second adhesive layer and the epitaxial structures are similar patterns in a vertical direction of the second substrate. The bonding pads are bonded on a plurality of pads of an external circuit by a thermal compression process. The second adhesive layer and the second substrate are removed, so as to expose the bottom surfaces of the epitaxial structures.

In an embodiment of the invention, the method for manufacturing the light emitting device further includes: while removing the growth substrate, removing a part of the epitaxial structures and the corresponding bonding pads formed thereon.

In an embodiment of the invention, after providing the first substrate on the upper surface of the first adhesive layer, a mask is provided at a side of the growth substrate away from the epitaxial structures; and while removing the growth substrate, a part of the epitaxial structures and the corresponding bonding pads formed thereon are removed.

In an embodiment of the invention, a maximum peak current density of an external quantum efficiency curve of each of the epitaxial structures is below 2 $A/cm^2$.

In an embodiment of the invention, a defect density of each of the epitaxial structures is less than $10^8/cm^2$.

Based on the above, the first adhesive layer of the invention encapsulates the epitaxial structures and the bonding pads. In other words, the securing force between the first adhesive layer and the epitaxial structures is improved by utilizing the multi-surface contact of the first adhesive layer and the epitaxial structures in the invention. Therefore, while removing the growth substrate, the intervals between the epitaxial structures may remain fixed, and no inclination phenomenon will occur on the epitaxial structures. Furthermore, the epitaxial structures are transferred from the first substrate onto the second substrate by the second adhesive layer. The bottom surfaces of the epitaxial structures are adhered on the second substrate by the second adhesive layer to effectively maintain the intervals between the epitaxial structures. In brief, according to the method for manufacturing the light emitting device of the invention, during the transferring process in among the growth substrate, the first substrate and the second substrate, the epitaxial structures may provide preferable alignment precision by the design of the first adhesive layer and the second adhesive layer.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
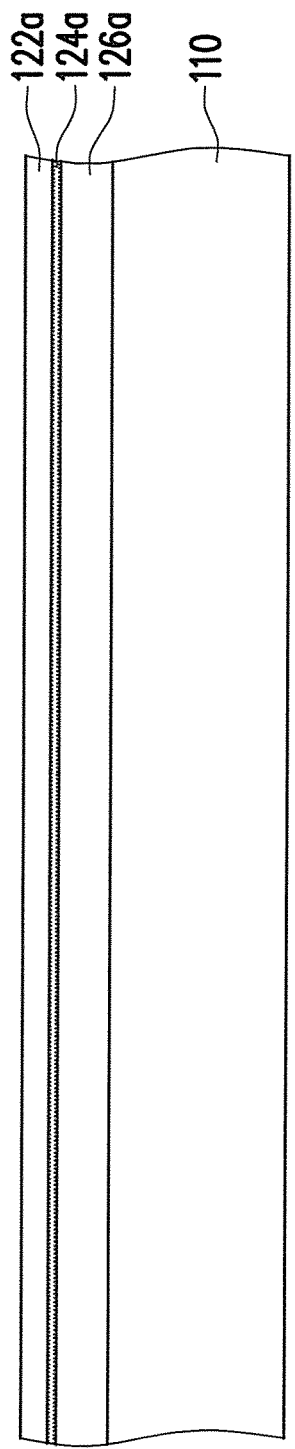
FIG. 1A to FIG. 1H' are schematic cross-sectional views illustrating a method for manufacturing a light emitting device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1H' are schematic cross-sectional views illustrating a method for manufacturing a light emitting device according to an embodiment of the invention. The method manufacturing for manufacturing the light emitting device of the present embodiment includes the following steps. Firstly, referring to FIG. 1B, a plurality of epitaxial structures 120 is formed on a growth substrate 110. The epitaxial structures 120 are distributively disposed on the growth substrate 110 and expose a part of the growth substrate 110. Herein, the growth substrate 110 is a sapphire substrate for example, and the epitaxial structures 120 are directly grown on the growth substrate 110.

Figure 1B:
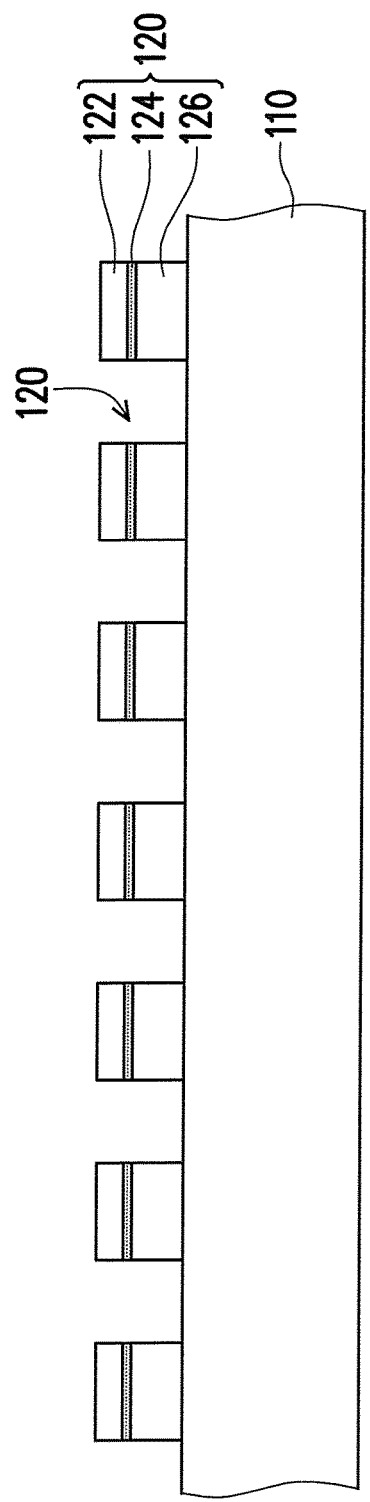
Figure 1B:
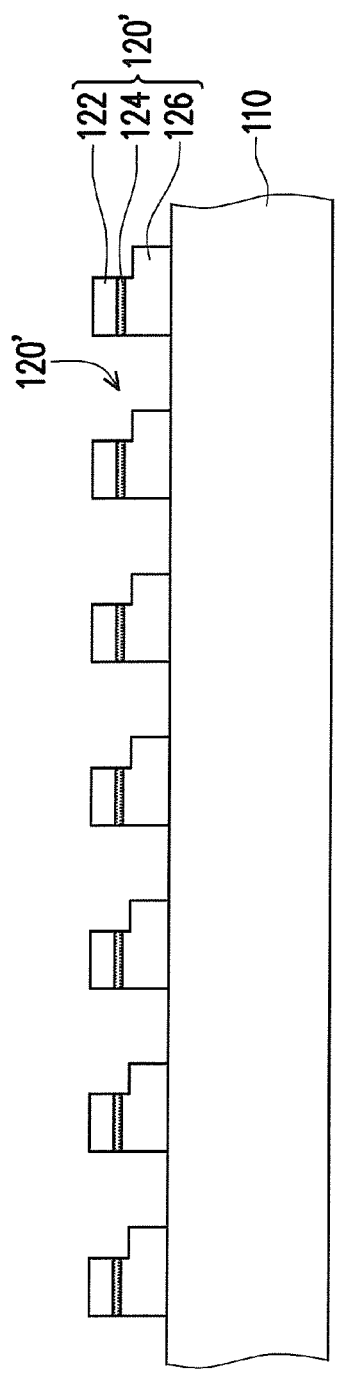

Specifically, referring to FIG. 1A and FIG. 1B together, the step of forming the epitaxial structures 120 on the growth substrate 110 includes: forming an epitaxial film on the growth substrate 110. More specifically, the step of forming the epitaxial film on the growth substrate 110 includes: forming a semiconductor material layer 126a on the growth substrate 110. The semiconductor material layer 126a completely covers the growth substrate 110. Subsequently, an active material layer 124a is formed on the semiconductor material layer 126a. The active material layer 124a completely covers the semiconductor material layer 126a. Thereafter, another semiconductor material layer 122a is formed on the active material layer 124a. The another semiconductor material layer 122a completely covers the active material layer 124a. Lastly, the epitaxial film (i.e., the semiconductor material layer 126a, the active material layer 124a and the another semiconductor material layer 122a) is patterned in manners of coating photo resistor (not illustrated), exposure, lithography and etching, so as to define the epitaxial structures 120. At this time, as shown in FIG. 1B, each of the epitaxial structures 120 includes a first-type semiconductor layer 122, an active layer 124 and a second-type semiconductor layer 126. The active layer 124 is located between the first-type semiconductor layer 122 and the second-type semiconductor layer 126, and the second-type semiconductor layer 126 is located between the active layer 124 and the growth substrate 110.

In each of the epitaxial structures 120 of the present embodiment, the first-type semiconductor layer 122 is a P-type semiconductor layer for example, the second-type semiconductor layer 126 is an N-type semiconductor layer for example, and the active layer 124 is a multiple quantum well (MQW) structure. In other embodiments not illustrated, it is also possible that the first-type semiconductor layer 122 is an N-type semiconductor layer for example, the second-type semiconductor layer 126 is a P-type semiconductor layer for example, and the active layer 124 is a multiple quantum well structure. However, the invention is not limited to the above. Particularly, in the present embodiment, a peak current density of an external quantum efficiency curve of each of the epitaxial structures 120 is, preferably, below 2 $A/cm^2$, and a maximum peak current density is, more preferably, between 0.2 $A/cm^2$ and 1.5 $A/cm^2$. That is to say, the epitaxial structures 120 of the present embodiment are adapted to operations in low current density. On the other hand, in the present embodiment, a side length of each of the epitaxial structures 120 is also less than a side length of the epitaxial structure (not illustrated) commonly used by the existing LED (e.g., between 0.2 mm and 1 mm); and the side length of each of the epitaxial structures 120 is, preferably, between 3 μm and 40 μm. Besides, in the present embodiment, a defect density of each of the epitaxial structures 120 is also less. The defect density of each of the epitaxial structures 120 is, preferably, less than $10^8/cm^2$, and said defect density is, more preferably, between $5 \times 10^5/cm^2$ and $10^8/cm^2$.

It is worth mentioning that, in the present embodiment, the epitaxial structures 120 depicted in FIG. 1B are embodied as a vertical LED chip; but in another embodiment, referring to FIG. 1B', epitaxial structures 120' defined by patterning the epitaxial film may also be a horizontal LED chip, which also falls in the scope of the invention for which protection is sought.

Figure 1C:
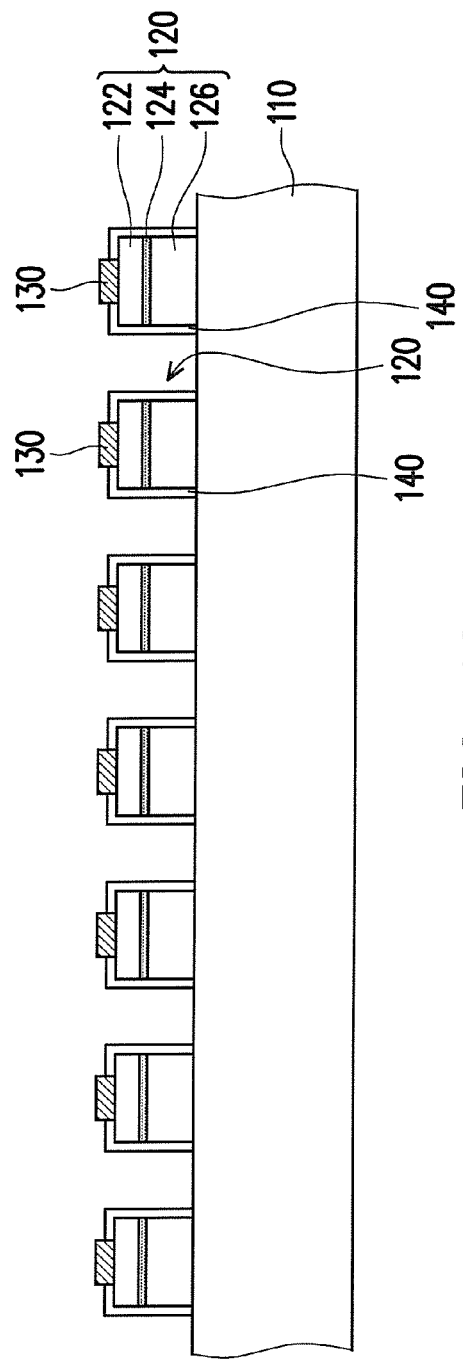
Figure 1C:
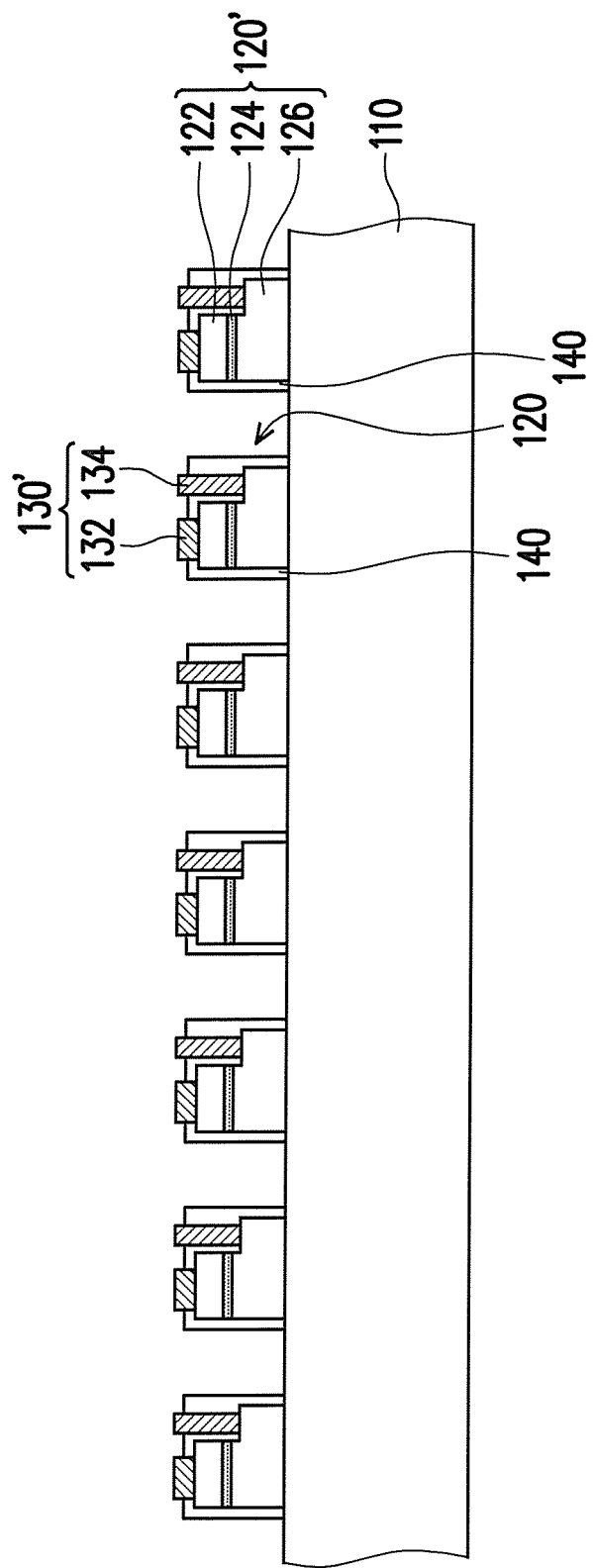

Subsequently, referring to FIG. 1C, a plurality of bonding pads 130 is formed on the epitaxial structures 120. The bonding pads 130 are respectively disposed on the epitaxial structures 120 and located on surfaces of the epitaxial structures 120 relatively away from the growth substrate 110. In other words, the surface of each of the epitaxial structures 120 relatively away from the growth substrate 110 is disposed with one of the bonding pads 130. Naturally, if the epitaxial structures 120' are embodied as the horizontal LED chip, bonding pads 130' include a plurality of first bonding pads 132 and a plurality of second bonding pads 134. Referring to FIG. 1C', the first bonding pads 132 are disposed on the first-type semiconductor layer 122 of the epitaxial structures 120', and the second bonding pads 134 are disposed on the second-type semiconductor layer 124 of the epitaxial structures 120'.

Subsequently, referring back to FIG. 1C and FIG. 1C', for effectively protecting the epitaxial structures (120, 120'), the method for manufacturing the light emitting device of the present embodiment may further include a plurality of insulation layers 140. The insulation layers 140 respectively encapsulate around the epitaxial structures (120, 120'), and the insulation layers 140 expose the bonding pads (130, 130') to effectively protect edges of the epitaxial structures (120, 120') from invasion of moisture and oxygen, so as to effectively improve overall product reliability. Herein, a material of the insulation layer 140 is, for example, $SiO_2$, SiN, $Al_2O_3$ or a combination of the above.

Figure 1D:
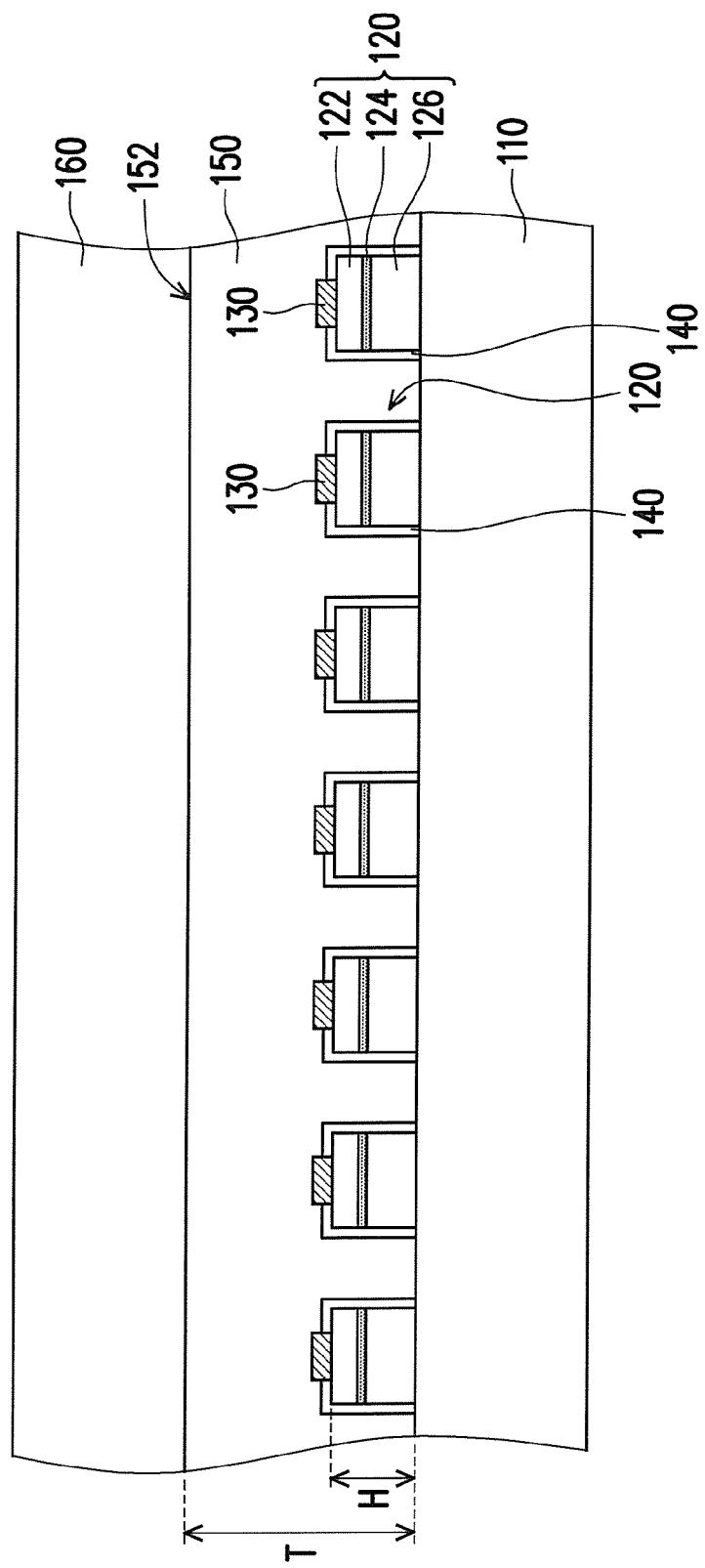
Figure 1D:
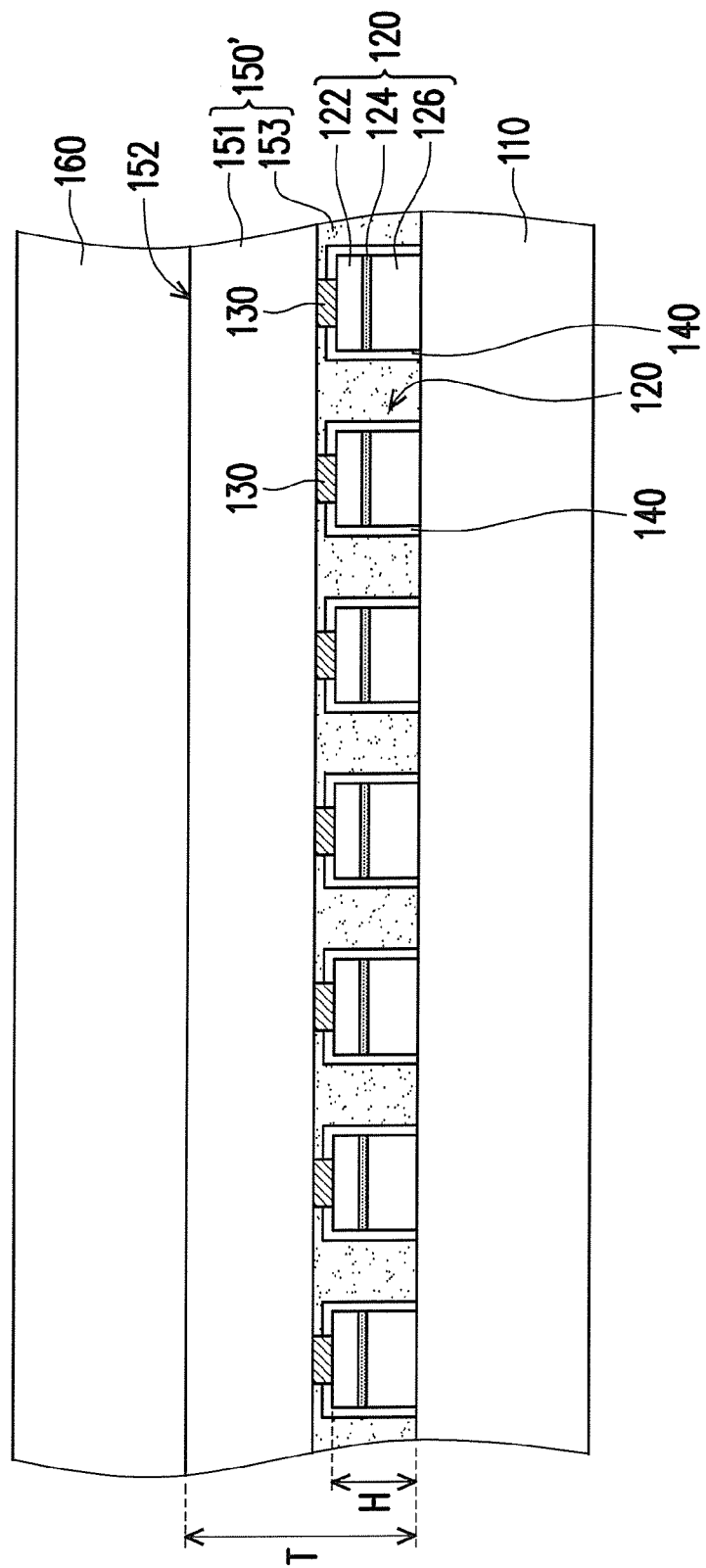

Subsequently, referring to FIG. 1D, a first adhesive layer 150 is formed on the growth substrate 110. The first adhesive layer 150 completely encapsulates the epitaxial structures 120 and the bonding pads 130. Herein, as shown in FIG. 1D, the first adhesive layer 150 covers the part of the growth substrate 110 exposed by the epitaxial structures 120, and fills gaps between the epitaxial structures 120. In other words, the first adhesive layer 150 and the epitaxial structures 120 of the present embodiment show a multi-surface contact, which can effectively improve a securing force between the first adhesive layer 150 and the epitaxial structures 120. Particularly, a thickness T of the first adhesive layer 150 is higher than a height H of each of the epitaxial structures 120. In addition, a method of forming the first adhesive layer 150 on the growth substrate 110 includes a spin coating method, but the invention is not limited thereto.

In another embodiment, referring to FIG. 1D', a first adhesive layer 150' may also be formed by stacking at least one layer of an insulation material layer (e.g., a first insulation material layer 151 and a second insulation material layer 153). A material of the first insulation material layer 151 and a material of the second insulation material layer 153 may be different or the same, which are not particularly limited herein.

Subsequently, referring back to FIG. 1D and FIG. 1D', a first substrate 160 is provided on an upper surface 152 of the first adhesive layer (150, 150'). The first substrate 160 is adhered on the growth substrate 110 by the first adhesive layer (150, 150'). At this time, the upper surface 152 of the first adhesive layer (150, 150') is completely covered by a surface of the first substrate 160. In other words, the first adhesive layer (150, 150') is connected to the first substrate 160 with the entire surface. Accordingly, deformation will not easily occur on the first adhesive layer (150, 150'), so that intervals between epitaxial structures 120 can maintain fixed.

Subsequently, referring to FIG. 1E and FIG. 1F together, the growth substrate 110 is removed, so as to expose a bottom surface 120a of each of the epitaxial structures 120 and a lower surface 154 of the first adhesive layer 150 opposite to the upper surface 152. Because a connection force between the epitaxial structures 120 and the growth substrate 110 is strong, in order to effectively separate the growth substrate 110 from the epitaxial structures 120, the first adhesive layer 150 must cover surroundings and top surfaces of epitaxial structures 120 before removing the growth substrate 110 by, for example, a laser lift-off (LLO) method in a manner of irradiating a laser L. The securing force between the first adhesive layer 150 and the epitaxial structures 120 may be improved by utilizing the multi-surface contact of the first adhesive layer 150 and the epitaxial structures 120. Therefore, while removing the growth substrate 110, the intervals between the epitaxial structures 120 may remain fixed, and no inclination phenomenon will occur on the epitaxial structures 120.

Figure 1E:
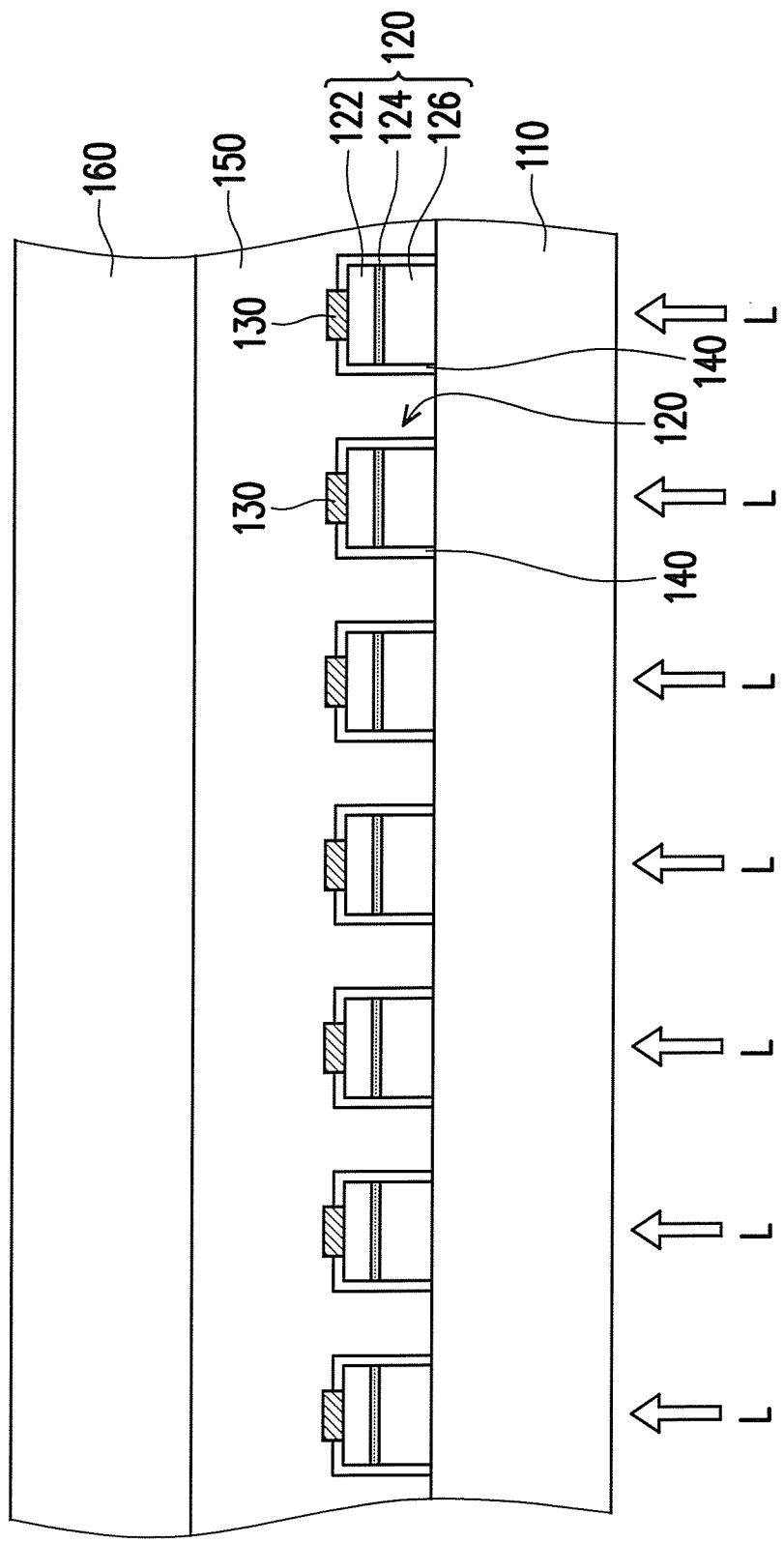
Figure 1E:
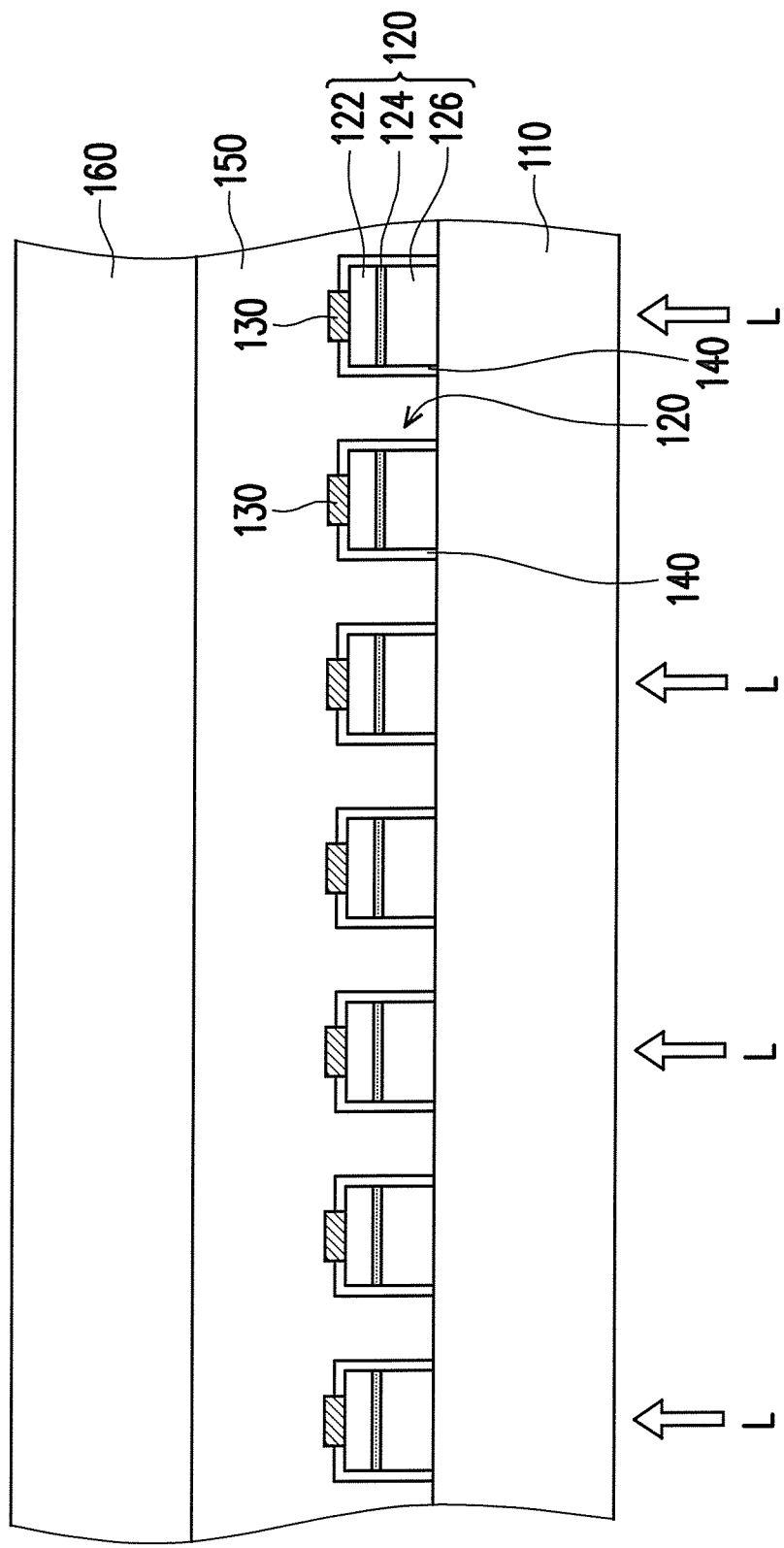
Figure 1F:
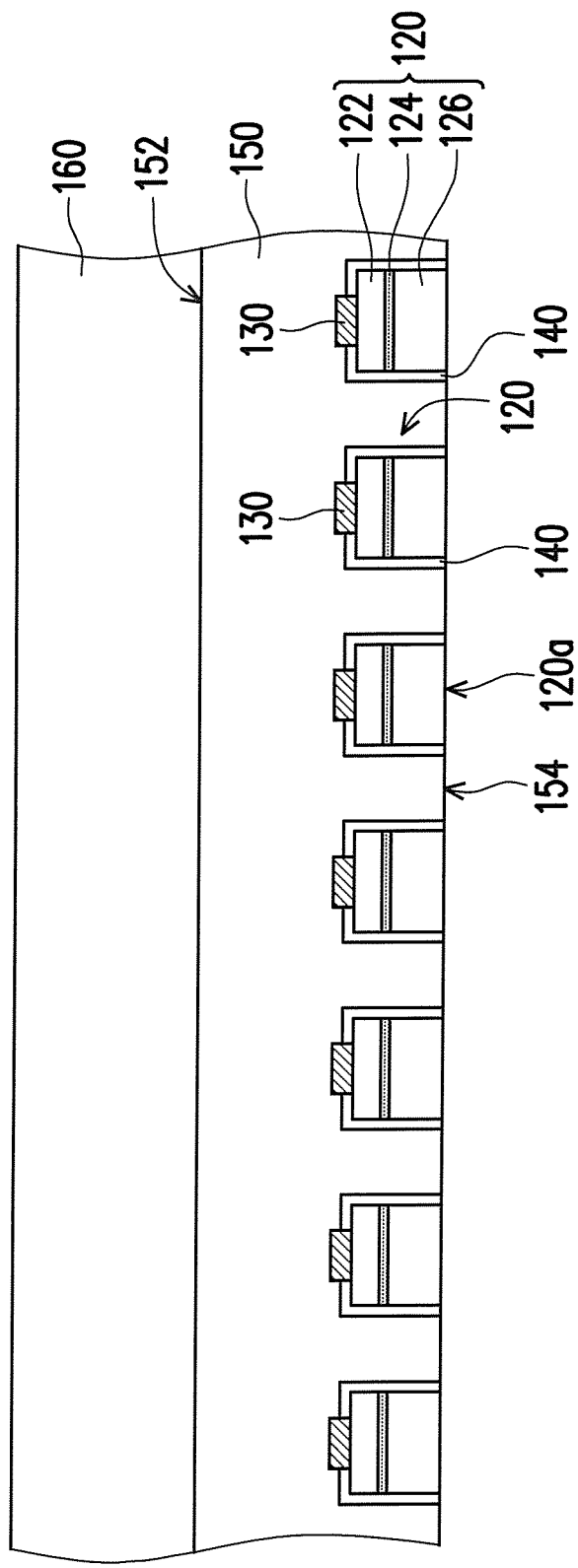
Figure 2A:
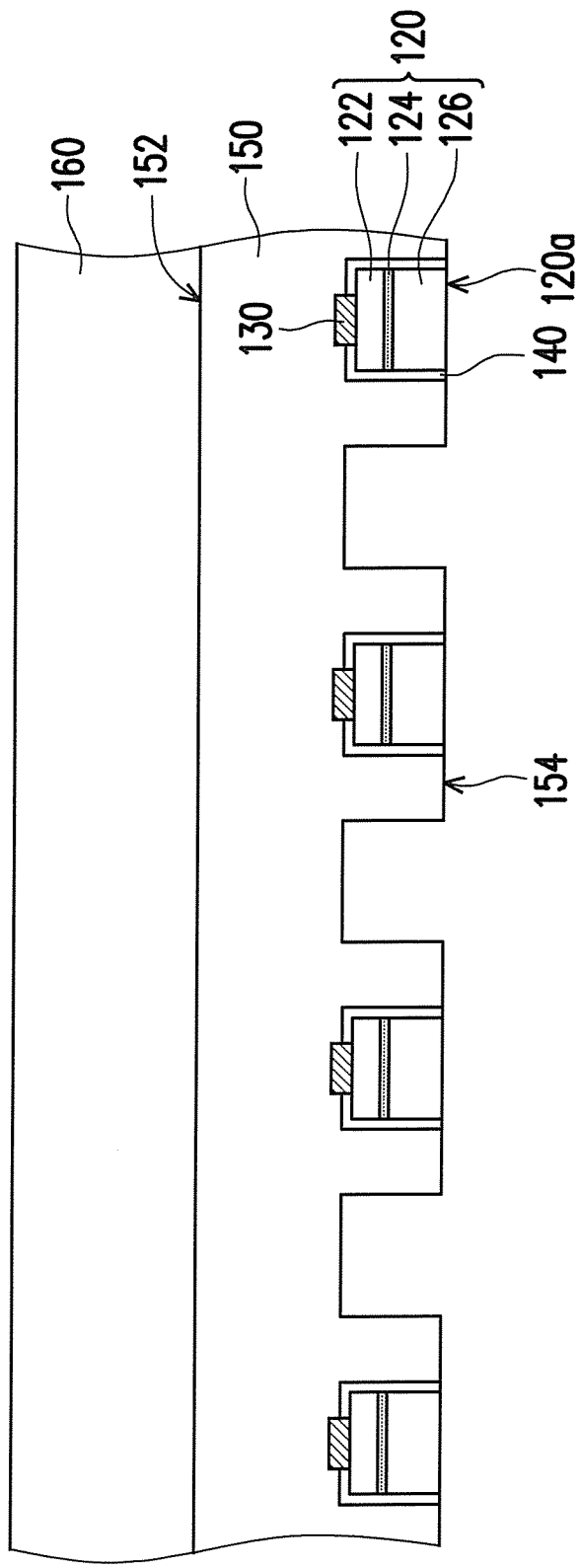
FIG. 2A to FIG. 2C are schematic cross-sectional views illustrating partial steps in a method for manufacturing a light emitting device according to another embodiment of the invention.

It should be noted that, the invention is not limited only to the manner of irradiating the laser L comprehensively for completely separating the epitaxial structures 120 from the growth substrate 110 as illustrated in FIG. 1E. In other embodiments, referring to FIG. 1E', the laser L may also be irradiated on the growth substrate 110 locally, so that a part of epitaxial structures 120 is separated from growth substrate 110 while the other part of the epitaxial structures 120 is still remained on the growth substrate 110. Thereafter, referring to FIG. 2A, while removing the growth substrate 110, the epitaxial structures 120 remained on the growth substrate 110 and the corresponding bonding pads 130 formed thereon are removed together. Alternatively, referring to FIG. 1E", after providing the first substrate 160 on the upper surface 152 of the first adhesive layer 150, a mask M is provided on a side of the growth substrate 110 away from the epitaxial structures 120. Subsequently, the laser L is irradiated comprehensively, and with the design of the mask M, a part of the epitaxial structures 120 may be separated from the growth substrate 110 while the other part of the epitaxial structures 120 is still remained on the growth substrate 110. Thereafter, referring to FIG. 2A, while removing the growth substrate 110, the epitaxial structures 120 remained on the growth substrate 110 and the corresponding bonding pads 130 formed thereon are removed together. In other words, FIG. 1E', FIG. 1E" and FIG. 2A illustrate that, the irradiation of the laser L is selectively applied on partial locations, such that a part of the epitaxial structures 120 is separated from the growth substrate 110 and fixed on the first substrate 160 by the first adhesive layer 150, whereas the rest of the epitaxial structures 120 is remained on the first substrate 160 and will be removed together while removing the growth substrate 110.

Figure 1G:
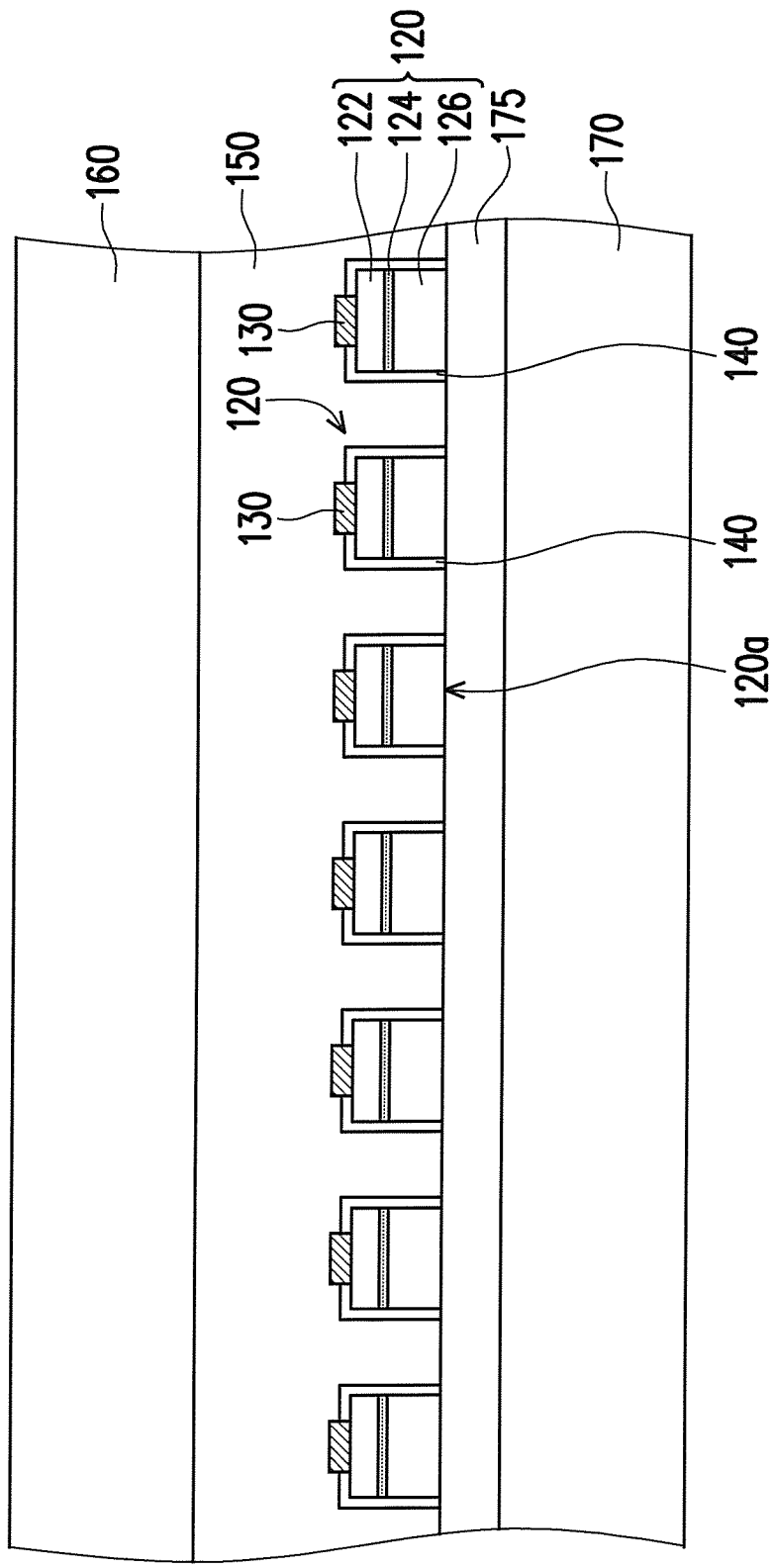
Figure 2B:
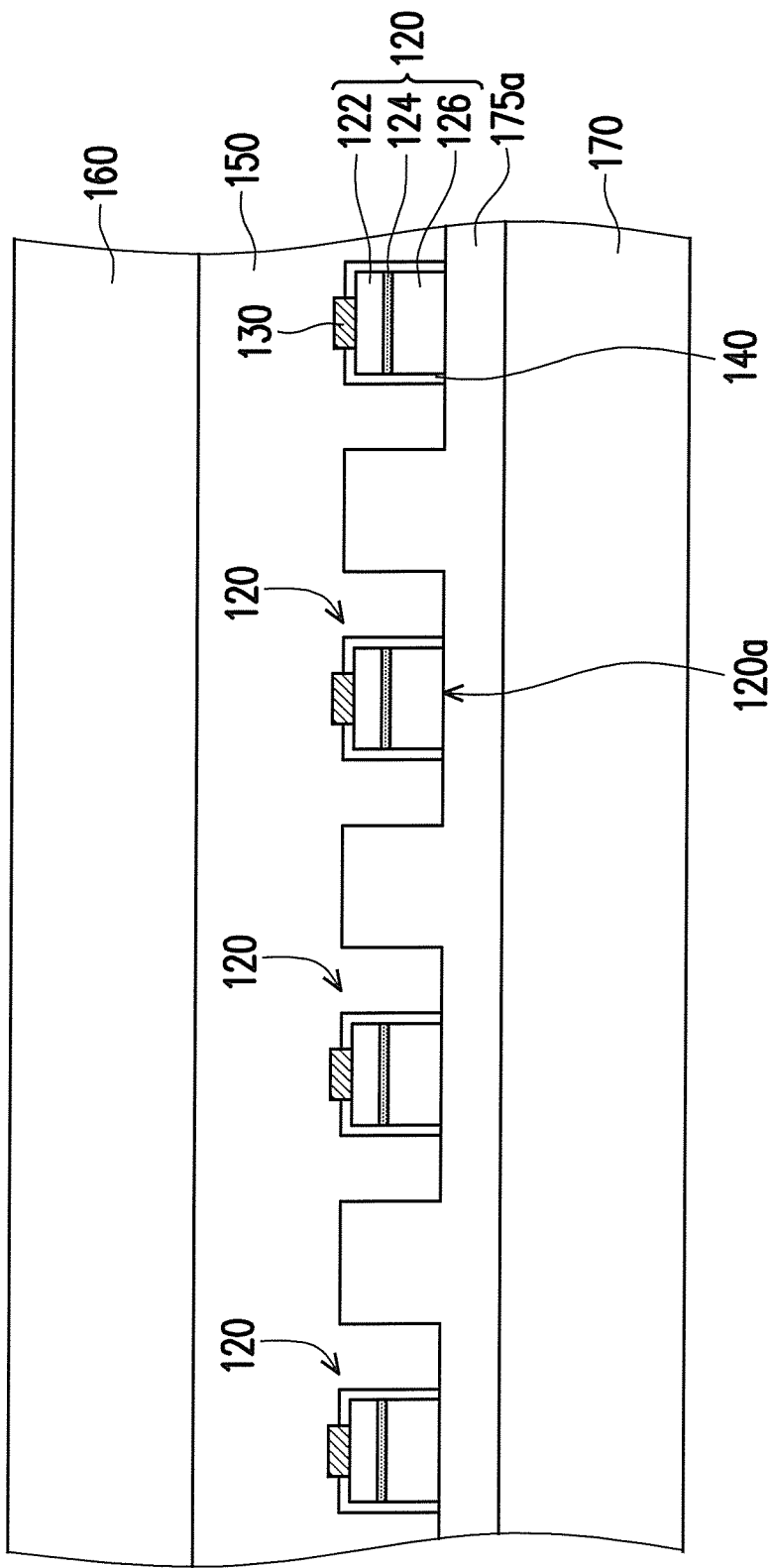

Thereafter, referring to FIG. 1G and FIG. 2B, a second substrate 170 and a second adhesive layer (175, 175a) disposed on the second substrate 170 are provided on the first substrate 160. Herein, the second adhesive layer (175, 175a) is located between the first substrate 160 and the second substrate 170 and in direct contact with the first adhesive layer 150, and the bottom surface 120a of each of the epitaxial structures 120 is adhered on the second substrate 170 by the second adhesive layer (175, 175a). In other words, the first adhesive layer 150 (with the multi-surface contact) and the second adhesive layer (175, 175a) (which is only in contact with the bottom surface 120a) have different contact areas with respect to the epitaxial structures 120. At this time, the second adhesive layer (175, 175a) completely covers a surface of the second substrate 170. In other words, the second adhesive layer (175, 175a) is connected to the second substrate 170 with the entire surface. Accordingly, deformation will not easily occur on the second adhesive layer (175, 175a), so that the intervals between epitaxial structures 120 can maintain fixed.

Figure 1H:
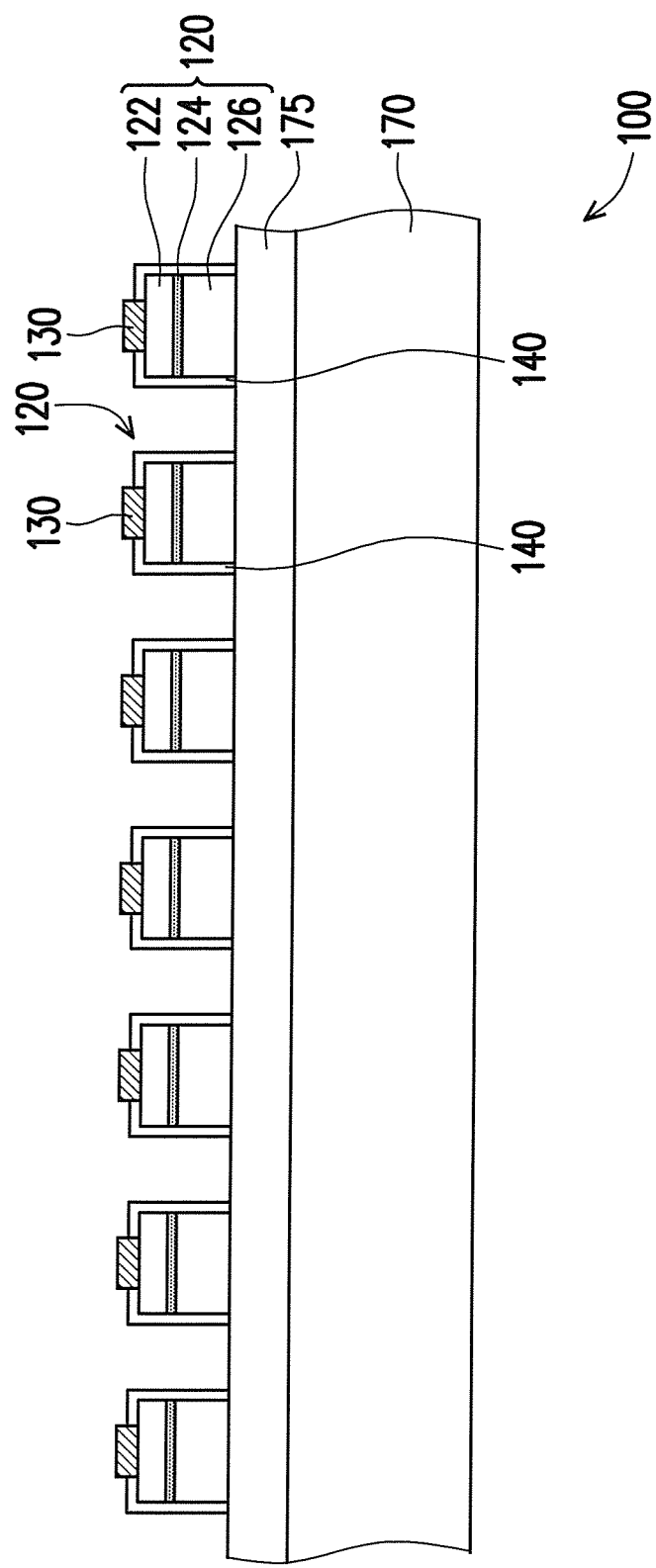
Figure 2C:
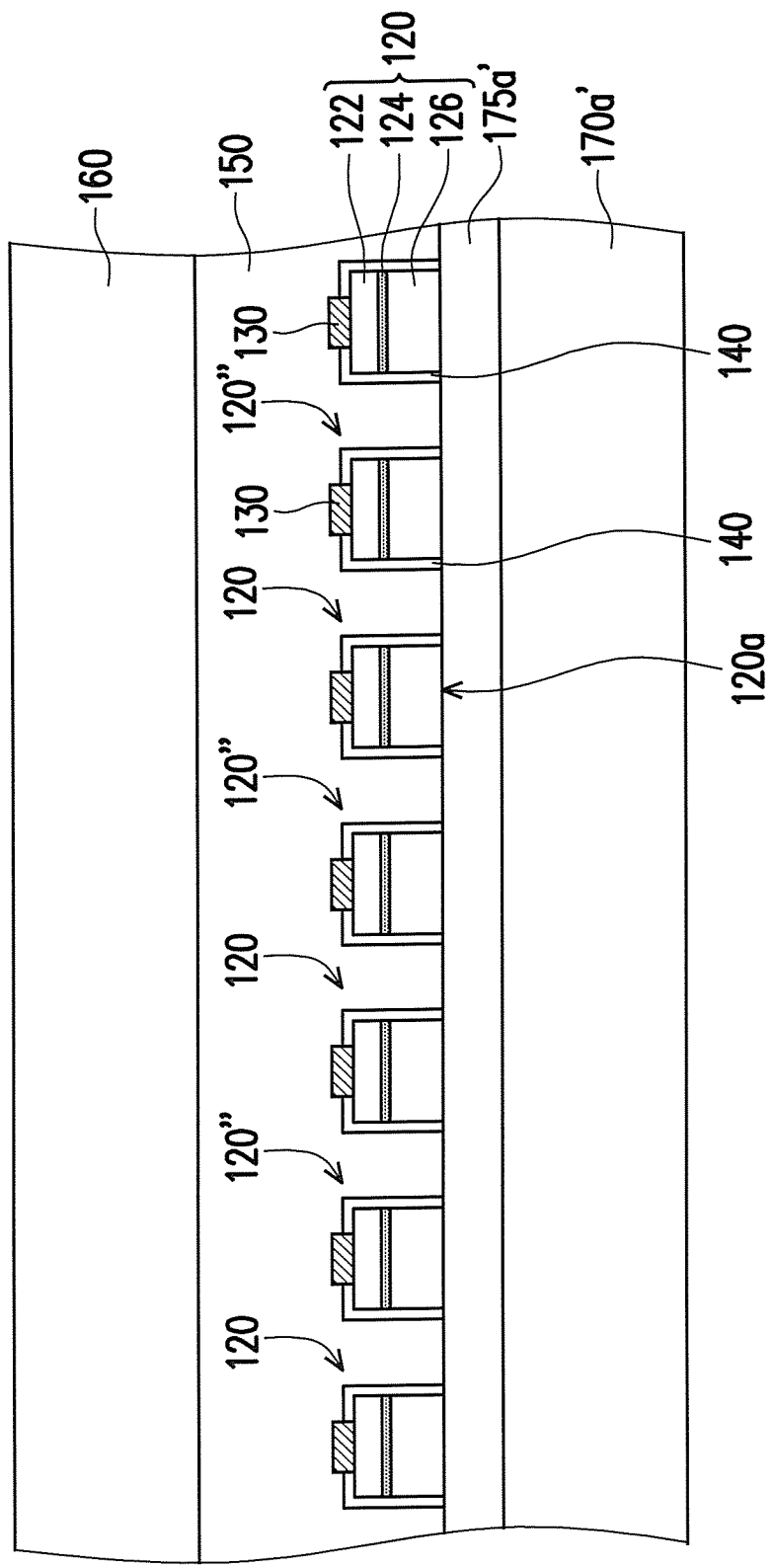

Alternatively, referring to FIG. 2C, after providing a second substrate 170a' and a second adhesive layer 175a' disposed on the second substrate 170a', a plurality of epitaxial structures 120" is formed on the second adhesive layer 175a'. Thereafter, the second substrate 170a' and the second adhesive layer 175a' disposed on the second substrate 170a' are combined with the first substrate 160, so that the epitaxial structures 120" and the epitaxial structures 120 are substantially located on the same plane. Accordingly, a light emitting device (not illustrated) obtained from subsequent manufacturing steps in FIG. 1G to FIG. 1H may include two different epitaxial structures (i.e., the epitaxial structures 120 and the epitaxial structure 120"). For instance, if the epitaxial structures 120 and the epitaxial structures 120" can emit different color lights, the light emitting device formed therefrom can emit the different color lights accordingly.

Lastly, referring to FIG. 1G and FIG. 1H together, the first adhesive layer 150 and the first substrate 160 are removed, so as to expose the bonding pads 130, the epitaxial structures 120 and a part of the second adhesive layer 175 between the epitaxial structures 120. Herein, the step of removing the first adhesive layer 150 and the first substrate 160 includes: removing the first substrate 160 in a lift-off manner. Subsequently, the first adhesive layer 150 is removed by a laser ablation, an ultraviolet irradiation, a solution decomposition or a thermal decomposition, so as to expose the insulation layers 140 encapsulating the epitaxial structures 120 and the bonding pads 130 located on the epitaxial structures 120. At this point, the manufacturing process of a light emitting device 100 is completed.

In another embodiment, referring to FIG. 1H', after removing the first adhesive layer 150 and the first substrate 160, the second adhesive layer 175 is patterned by using the epitaxial structures 120 as an etching mask, so that the second adhesive layer 175' and the epitaxial structures 120 are similar patterns in a vertical direction of the second substrate 170. In other words, the second adhesive layer 175' is substantially a patterned adhesive layer which exposes a part of the second substrate 170 and is disposed corresponding to each of the epitaxial structures 120. At this point, the manufacturing process of a light emitting device 100' is completed.

Figure 1I:
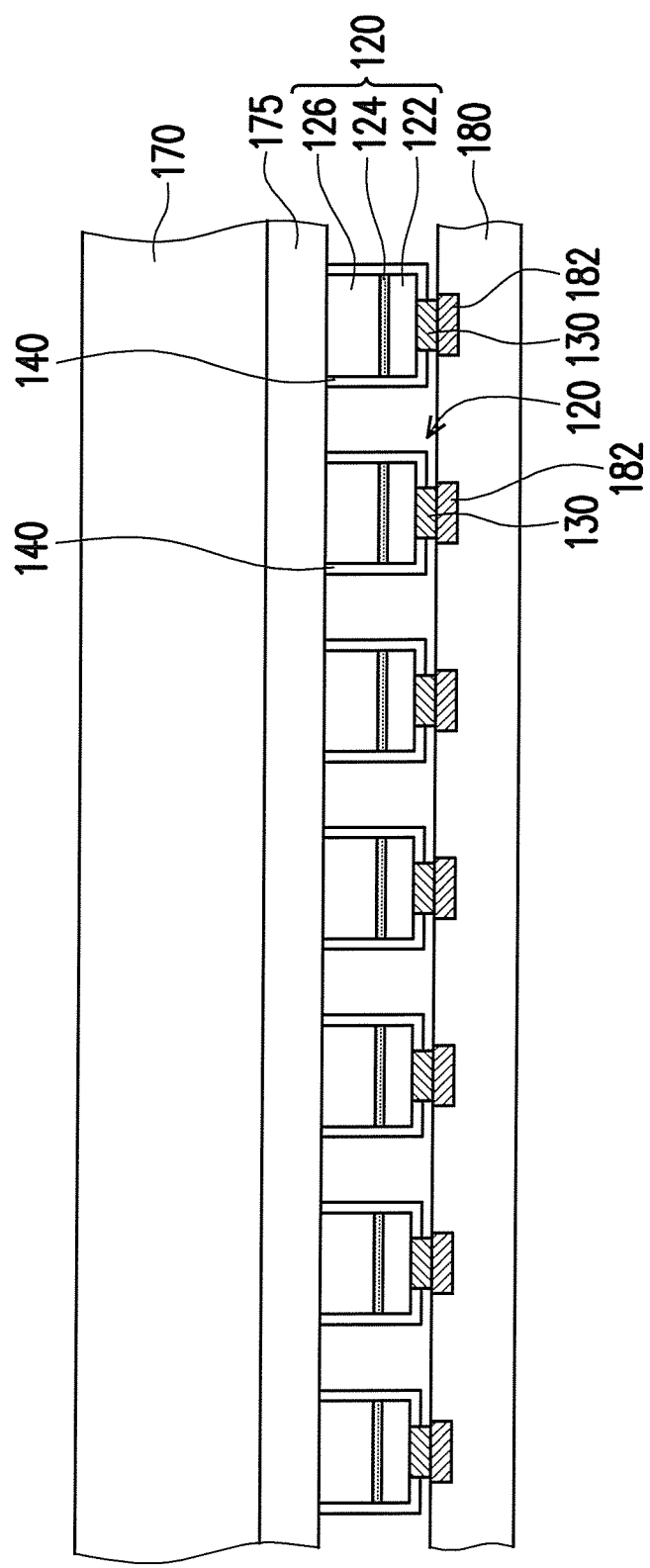
FIG. 1I to FIG. 1J are schematic cross-sectional views illustrating a manufacturing method for bonding the light emitting device of FIG. 1H to an external circuit.
Figure 1I:
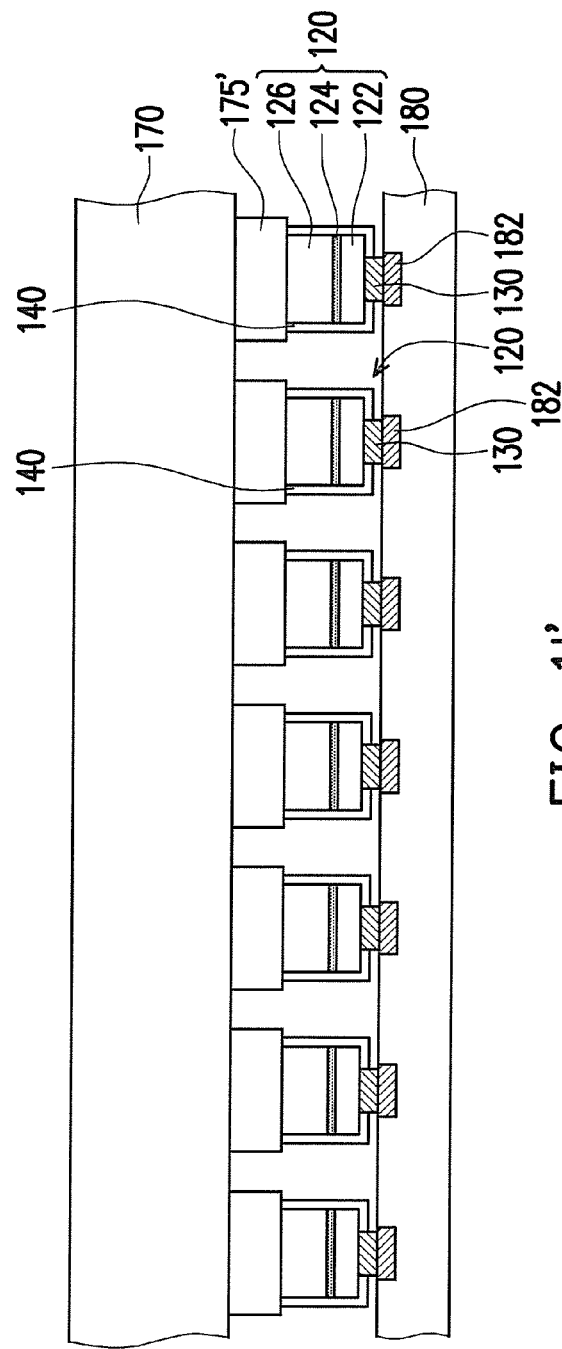
Figure 1J:
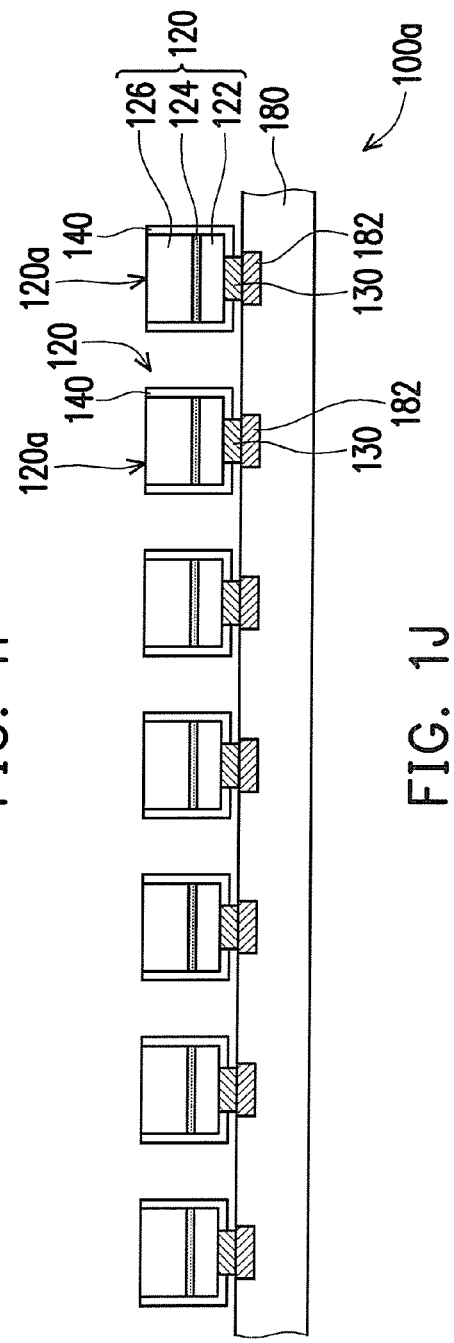

Referring to FIG. 1I and 1I', for improving applicability of the light emitting device 100, in another two embodiments, after removing the first adhesive layer 150 and the first substrate 160, the bonding pads 130 may be bonded on a plurality of pads 182 of an external circuit 180 by a thermal compression process. Thereafter, referring to FIG. 1I, FIG. 1I' and FIG. 1J, the second adhesive layer (175, 175') and the second substrate 170 are removed, so as to expose the bottom surfaces 120a of the epitaxial structures 120. Herein, the step of removing the second adhesive layer (175, 175') and the second substrate 170 includes: removing the second substrate 170 in a lift-off manner. Subsequently, the second adhesive layer (175, 175') is removed in a wet etching manner. In other words, the first adhesive layer 150 and the second adhesive layer (175, 175') are removed by adopting different manners. At this point, the manufacturing process of a light emitting device 100a is completed.

In summary, the first adhesive layer of the invention encapsulates the epitaxial structures and the bonding pads. In other words, the securing force between the first adhesive layer and the epitaxial structures is improved by utilizing the multi-surface contact of the first adhesive layer and the epitaxial structures in the invention. Therefore, while removing the growth substrate, the intervals between the epitaxial structures may remain fixed, and no inclination phenomenon will occur on the epitaxial structures. Furthermore, the epitaxial structures are transferred from the first substrate onto the second substrate by the second adhesive layer to expose the bonding pads, and then electrically bonded to the external circuit by the bonding pads. The bottom surfaces of the epitaxial structures are adhered on the second substrate by the second adhesive layer to effectively maintain the intervals between the epitaxial structures. In brief, according to the method for manufacturing the light emitting device of the invention, during the transferring process in among the growth substrate, the first substrate and the second substrate, the epitaxial structures may provide preferable alignment precision by the design of the first adhesive layer and the second adhesive layer.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A method for manufacturing a light emitting device, comprising:

forming a plurality of epitaxial structures on a growth substrate, wherein the epitaxial structures are distributively disposed on the growth substrate and expose a part of the growth substrate;

forming a plurality of bonding pads on the epitaxial structures;

forming a first adhesive layer on the growth substrate, wherein the first adhesive layer encapsulates the epitaxial structures and the bonding pads;

providing a first substrate on an upper surface of the first adhesive layer, wherein the first substrate is adhered on the growth substrate by the first adhesive layer;

removing the growth substrate, so as to expose a bottom surface of each of the epitaxial structures and a lower surface of the first adhesive layer opposite to the upper surface;

providing a second substrate and a second adhesive layer disposed on the second substrate, wherein the second adhesive layer is located between the first substrate and the second substrate, and the bottom surface of each of the epitaxial structures is adhered on the second substrate by the second adhesive layer;

removing the first adhesive layer and the first substrate;

after removing the first adhesive layer and the first substrate, bonding the bonding pads to a plurality of pads of an external circuit by a thermal compression process; and removing the second adhesive layer and the second substrate, so as to expose the bottom surfaces of the epitaxial structures.

2. The method for manufacturing the light emitting device of claim 1, wherein while forming the first adhesive layer on the growth substrate, the first adhesive layer covers the part of the growth substrate exposed by the epitaxial structures, and fills gaps between the epitaxial structures.

3. The method for manufacturing the light emitting device of claim 1, wherein the step of forming the epitaxial structures on the growth substrate comprises:

forming an epitaxial film on the growth substrate; and
patterning the epitaxial film, so as to define the epitaxial structures, wherein each of the epitaxial structures comprises a first-type semiconductor layer, an active layer and a second-type semiconductor layer, the active layer is located between the first-type semiconductor layer and the second-type semiconductor layer, and the second-type semiconductor layer is located between the active layer and the growth substrate.

4. The method for manufacturing the light emitting device of claim 1, wherein a thickness of the first adhesive layer is higher than a height of each of the epitaxial structures.

5. The method for manufacturing the light emitting device of claim 1, wherein the first adhesive layer is formed by stacking at least one layer of an insulation material layer.

6. The method for manufacturing the light emitting device of claim 1, wherein a method of forming the first adhesive layer on the growth substrate comprises a spin coating method.

7. The method for manufacturing the light emitting device of claim 1, wherein a method of removing the growth substrate comprises a laser lift-off method.

8. The method for manufacturing the light emitting device of claim 1, wherein the step of removing the first adhesive layer and the first substrate comprises:
  removing the first substrate in a lift-off manner; and
  removing the first adhesive layer by a laser ablation, an ultraviolet irradiation, a solution decomposition or a thermal decomposition.

9. The method for manufacturing the light emitting device of claim 1, wherein the step of removing the second adhesive layer and the second substrate comprises:
  removing the second substrate in a lift-off manner; and
  removing the second adhesive layer in a wet etching manner.

10. The method for manufacturing the light emitting device of claim 1, further comprising:
  after removing the first adhesive layer and the first substrate, patterning the second adhesive layer by using the epitaxial structures as an etching mask, so that the second adhesive layer and the epitaxial structures are similar patterns in a vertical direction of the second substrate;
  bonding the bonding pads on a plurality of pads of an external circuit by a thermal compression process; and
  removing the second adhesive layer and the second substrate, so as to expose the bottom surfaces of the epitaxial structures.

11. The method for manufacturing the light emitting device of claim 1, further comprising:
  while removing the growth substrate, removing a part of the epitaxial structures and the corresponding bonding pads formed thereon.

12. The method for manufacturing the light emitting device of claim 1, further comprising:
  after providing the first substrate on the upper surface of the first adhesive layer, providing a mask at a side of the growth substrate away from the epitaxial structures; and
  while removing the growth substrate, removing a part of the epitaxial structures and the corresponding bonding pads formed thereon.

13. The method for manufacturing the light emitting device of claim 1, wherein a maximum peak current density of an external quantum efficiency curve of each of the epitaxial structures is below 2 A/cm$^2$.

14. The method for manufacturing the light emitting device of claim 1, wherein a defect density of each of the epitaxial structures is less than $10^8$/cm$^2$.

15. A method for manufacturing a light emitting device, comprising:
  forming a plurality of epitaxial structures on a growth substrate, wherein the epitaxial structures are distributively disposed on the growth substrate and expose a part of the growth substrate, wherein a maximum peak current density of an external quantum efficiency curve of each of the epitaxial structures is below 2 A/cm$^2$;
  forming a plurality of bonding pads on the epitaxial structures;
  forming a first adhesive layer on the growth substrate, wherein the first adhesive layer encapsulates the epitaxial structures and the bonding pads;
  providing a first substrate on an upper surface of the first adhesive layer, wherein the first substrate is adhered on the growth substrate by the first adhesive layer;
  removing the growth substrate, so as to expose a bottom surface of each of the epitaxial structures and a lower surface of the first adhesive layer opposite to the upper surface;
  providing a second substrate and a second adhesive layer disposed on the second substrate, wherein the second adhesive layer is located between the first substrate and the second substrate, and the bottom surface of each of the epitaxial structures is adhered on the second substrate by the second adhesive layer; and
  removing the first adhesive layer and the first substrate.

16. The method for manufacturing the light emitting device of claim 15, wherein while forming the first adhesive layer on the growth substrate, the first adhesive layer covers the part of the growth substrate exposed by the epitaxial structures, and fills gaps between the epitaxial structures.

17. The method for manufacturing the light emitting device of claim 15, wherein a thickness of the first adhesive layer is higher than a height of each of the epitaxial structures.

18. The method for manufacturing the light emitting device of claim 15, wherein the first adhesive layer is formed by stacking at least one layer of an insulation material layer.

19. The method for manufacturing the light emitting device of claim 15, further comprising:
  after removing the first adhesive layer and the first substrate, patterning the second adhesive layer by using the epitaxial structures as an etching mask, so that the second adhesive layer and the epitaxial structures are similar patterns in a vertical direction of the second substrate;
  bonding the bonding pads on a plurality of pads of an external circuit by a thermal compression process; and
  removing the second adhesive layer and the second substrate, so as to expose the bottom surfaces of the epitaxial structures.

20. The method for manufacturing the light emitting device of claim 15, further comprising:
  while removing the growth substrate, removing a part of the epitaxial structures and the corresponding bonding pads formed thereon.

21. The method for manufacturing the light emitting device of claim 15, further comprising:
  after providing the first substrate on the upper surface of the first adhesive layer, providing a mask at a side of the growth substrate away from the epitaxial structures; and
  while removing the growth substrate, removing a part of the epitaxial structures and the corresponding bonding pads formed thereon.

22. The method for manufacturing the light emitting device of claim 15, wherein a defect density of each of the epitaxial structures is less than $10^8/cm^2$.

* * * * *